(12) United States Patent
Kaplan et al.

(10) Patent No.: US 9,614,192 B2
(45) Date of Patent: Apr. 4, 2017

(54) METHOD FOR FORMING THIN FILM AND METHOD FOR FABRICATING ORGANIC LIGHT-EMITTING DIODE (OLED) DISPLAY USING THE SAME

(71) Applicant: Samsung Display Co., Ltd., Yongin, Gyeonggi-do (KR)

(72) Inventors: Leonid Kaplan, Yongin (KR); Valeriy Prushinskiy, Yongin (KR); Won-Baek Lee, Yongin (KR); Ji-Ryun Park, Yongin (KR); Hee-Sang Park, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 217 days.

(21) Appl. No.: 14/487,946

(22) Filed: Sep. 16, 2014

(65) Prior Publication Data
US 2015/0079711 A1    Mar. 19, 2015

(30) Foreign Application Priority Data

Sep. 17, 2013 (KR) .................. 10-2013-0111497

(51) Int. Cl.
*H01L 51/56* (2006.01)
*C23C 14/22* (2006.01)
(Continued)

(52) U.S. Cl.
CPC ............ *H01L 51/56* (2013.01); *C23C 14/042* (2013.01); *C23C 14/225* (2013.01); *C23C 14/243* (2013.01); *H01L 51/0004* (2013.01); *H01L 51/0011* (2013.01); *H01L 51/5206* (2013.01); *H01L 51/5221* (2013.01); *H01L 27/3283* (2013.01); *H01L 27/3295* (2013.01)

(58) Field of Classification Search
CPC . H01L 51/56; H01L 51/5221; H01L 51/3246; H01L 51/0004; H01L 51/0011; H01L 51/5206; H01L 27/3283; H01L 27/3295; C23C 14/243; C23C 14/042; C23C 14/50; C23C 14/04; C23C 14/044; C23C 14/083; C23C 14/225
See application file for complete search history.

(56) References Cited

U.S. PATENT DOCUMENTS

| | | | |
|---|---|---|---|
| 5,294,869 A | * | 3/1994 | Tang ...................... C09K 11/06 313/500 |
| 5,294,870 A | | 3/1994 | Tang et al. |

(Continued)

FOREIGN PATENT DOCUMENTS

| | | |
|---|---|---|
| KR | 10-2010-0084655 A | 7/2010 |
| KR | 10-2012-0042153 A | 5/2012 |

*Primary Examiner* — Michael Trinh
(74) *Attorney, Agent, or Firm* — Knobbe, Martens, Olson & Bear, LLP

(57) ABSTRACT

A method for forming a thin film for fabricating an organic light-emitting diode (OLED) display is disclosed. In one aspect, the method includes forming a plurality of shadow masks on a substrate. The substrate is then bent to form a predetermined curvature in the substrate. A deposition source is placed at a position having an equal angle with respect to central and peripheral portions of the substrate. The method also includes depositing a deposition material from the deposition source on the substrate and the shadow masks to form a thin film.

29 Claims, 8 Drawing Sheets

(51) Int. Cl.
*H01L 51/52* (2006.01)
*C23C 14/04* (2006.01)
*H01L 51/00* (2006.01)
*C23C 14/24* (2006.01)
*H01L 27/32* (2006.01)

(56) References Cited

U.S. PATENT DOCUMENTS

| | | | |
|---|---|---|---|
| 6,255,775 B1* | 7/2001 | Ikuko | H01L 27/3211 313/402 |
| 6,965,198 B2* | 11/2005 | Haase | C23C 14/042 313/501 |
| 7,093,937 B2* | 8/2006 | Bauer | C23C 14/044 351/159.57 |
| 9,172,064 B2* | 10/2015 | Lee | C23C 14/042 |
| 2007/0072128 A1* | 3/2007 | Miceli | H01L 21/0274 430/311 |
| 2007/0072337 A1* | 3/2007 | Matsuzaki | C23C 14/042 438/99 |
| 2011/0151135 A1* | 6/2011 | Nagae | C23C 14/083 427/523 |
| 2012/0100644 A1* | 4/2012 | Prushinskiy | C23C 14/042 438/22 |
| 2014/0191201 A1* | 7/2014 | Hamer | H01L 51/0011 257/40 |

* cited by examiner

METHOD FOR FORMING THIN FILM AND METHOD FOR FABRICATING ORGANIC LIGHT-EMITTING DIODE (OLED) DISPLAY USING THE SAME

CROSS-REFERENCE TO RELATED APPLICATIONS

This application claims priority to and the benefit of Korean Patent Application No. 10-2013-0111497, filed on Sep. 17, 2013, in the Korean Intellectual Property Office, the entire contents of which are incorporated herein by reference in their entirety.

BACKGROUND

Field

The described technology generally relates to a method for forming a thin film and a method for fabricating an organic light-emitting diode (OLED) display using the same.

Description of the Related Technology

Display devices include circuits having a thin film transistor and a capacitor. Each of these electrical components includes electrodes which are electrically connected to each other through a wire.

SUMMARY OF CERTAIN INVENTIVE ASPECTS

One inventive aspect is a method for forming a thin film and a method for fabricating an OLED display using the same, which can decrease the fabricating costs and increase the yield thereof.

Another aspect is a thin film and a method for fabricating an OLED display including the same, in which a plurality of electrodes or wires can be formed with a substantially uniform thickness at a substantially uniform spacing.

Another aspect is a method for forming a thin film, the method including forming a plurality of shadow masks on a substrate, bending and then fixing the substrate so that a surface of the substrate has a predetermined curvature, disposing a deposition source at a position having an equal angle with respect to central and peripheral portions of the substrate, and allowing a thin film to be deposited on the substrate including the shadow masks from the deposition source.

The substrate may be made of at least one of glass, polymer, metal, or silicon, or one or more compounds thereof.

The shadow masks may be formed in row and column directions. The shadow masks in the row direction may be arranged at about an equal interval and the shadow masks in the column direction may be connected to each other.

The shadow mask may include a vertex positioned on a vertical line with respect to the surface of the substrate, a first side connected at an acute angle to the surface of the substrate from the vertex, and a second side connected to the surface of the substrate from the vertex using the length of the first side as a radius.

The vertex may be positioned on the line connecting the surface of the substrate and the deposition source. The first and second sides may be formed to have curved surfaces. Alternatively, the first side may be formed to have a planar surface and the second side may be formed to have a curved surface.

The substrate may be fixed to a substrate support having a surface curved to have the curvature. The substrate support may be formed into a symmetric structure in which surfaces curved to have the curvature are symmetric to each other and the substrates may be respectively fixed to the surfaces with the symmetric structure.

The deposition source may be disposed to have a center axis substantially parallel to the normal of the central portion of the substrate.

The curvature of the surface of the substrate may correspond to a logarithmic spiral. The equal angle may be one angle selected from a range of about 1 to about 45 degrees.

The method may further include disposing, on the substrate, an open mask in which an opening is formed so that the substrate including the shadow masks is exposed.

The thin film may be deposited through one of sputtering, evaporation, vaporization, or sublimation. The thin film may be made of at least one of a conducting material or a metal.

Another aspect is a method for fabricating an OLED display, the method including forming a first electrode on a substrate, forming an insulating layer on the substrate including the first electrode and then patterning the insulating layer so that a first electrode in an emission area is exposed, forming an organic thin film layer on the exposed first electrode, forming a plurality of shadow masks on the insulating layer, bending and then fixing the substrate so that a surface of the substrate has a predetermined curvature, disposing a deposition source at a position having an equal angle with respect to central and peripheral portions of the substrate, and forming a second electrode by allowing a thin film to be deposited on the shadow mask and the organic thin film layer from the deposition source.

The substrate may be made of at least one of glass, polymer, metal, or silicon, or one or more compounds thereof.

The shadow mask may include a vertex positioned on a vertical line with respect to the surface of the substrate, a first side connected at an acute angle to the surface of the substrate from the vertex, and a second side connected up to the surface of the substrate from the vertex using the length of the first side as a radius.

The vertex may be positioned on the line connecting the surface of the substrate and the deposition source.

The substrate may be fixed to a substrate support having a surface curved to have the curvature. The substrate support may be formed into a symmetric structure in which surfaces curved to have the curvature are symmetric to each other and the substrates may be respectively fixed to the surfaces with the symmetric structure.

The deposition source may be disposed to have a center axis substantially parallel to the normal of the central portion of the substrate.

The curvature of the surface of the substrate may correspond to a logarithmic spiral. The equal angle may be one angle selected from a range of about 1 to about 45 degrees.

The method may further include disposing, on the substrate, an open mask in which an opening is formed so that the substrate including the shadow masks is exposed.

The thin film may be deposited through one of sputtering, evaporation, vaporization, sublimation. The thin film may be made of any one of a conducting material or a metal.

The method may further include forming a thin film transistor on the substrate, forming an insulating layer on the substrate including the thin film transistor, and forming, in the insulating layer, a via hole for connecting the thin film transistor and the first electrode.

Another aspect is a method for forming a thin film comprising forming shadow masks on a substrate; bending the substrate to have a predetermined curvature; placing a deposition source at a position having a substantially equal angle with respect to the shadow masks and central and peripheral portions of the substrate; and depositing a deposition material from the deposition source onto the substrate and the shadow masks so as to form a thin film.

In exemplary embodiments, the substrate includes at least one material selected from the group consisting of glass, polymer, metal and silicon. The shadow masks can be formed in row and column directions. The shadow masks i) can be substantially equally spaced apart in the row direction and ii) can extend in the column direction. Each of the shadow masks can include i) a vertex formed over the substrate, ii) a first side extending from the substrate to the vertex and forming an acute angle with the substrate, and iii) a second side extending from the substrate to the vertex and forming a curved surface with a radius substantially equal to the length of the first side. The vertex can be positioned on a line connecting the surface of the substrate and the deposition source. The first and second sides can be formed in a curved surface. The first side can have a plane surface and the second side can have a curved surface.

In exemplary embodiments, the method further comprises fixing the substrate to a substrate support having a curved surface substantially equal to the predetermined curvature of the substrate. The method can further comprise fixing another substrate to the substrate support, wherein the substrate support has a substantially symmetric structure having two curved surfaces substantially equal to the predetermined curvatures of the substrates. The deposition source can be located such that a center axis of the deposition source is substantially parallel to the normal of the central portion of the substrate.

In exemplary embodiments, the predetermined curvature of the substrate is a logarithmic spiral defined in polar coordinates reflected in the following Equation 1 or Equation 2 with the deposition source located at the pole:

$$r = ae^{b\theta} \qquad \text{Equation 1}$$

$$\theta = (1/b)\ln(r/a), \qquad \text{Equation 2}$$

wherein e is the base of the natural logarithm, a is an arbitrary real constant, and b is $\cot\theta$.

In exemplary embodiments, the equal angle is between about 1 degree to about 45 degrees. The method can further comprise disposing an open mask over the substrate wherein the open mask has an opening which exposes an area of the substrate including the shadow masks. The depositing can comprise at least one of sputtering method, evaporation method, vaporization method, or sublimation method. The deposition material can comprise at least one of a conducting material or a metal.

Another aspect is a method for fabricating an organic light-emitting diode (OLED) display comprising forming a first electrode including an emission area over a substrate; forming an insulating layer over the substrate and the first electrode; patterning the insulating layer to expose the emission area of the first electrode; forming an organic thin film layer over the emission area; forming a plurality of shadow masks over the insulating layer; bending the substrate to have a predetermined curvature; placing a deposition source at a position having a substantially equal angle with respect to the shadow masks and central and peripheral portions of the substrate; and depositing a deposition material from the deposition source onto the shadow masks and the organic thin film layer so as to form a second electrode.

In exemplary embodiments, the substrate includes at least one material selected from the group consisting of glass, polymer, metal and silicon. Each of the shadow masks can include i) a vertex formed over the insulating layer, ii) a first side extending from the insulating layer to the vertex, and iii) a second side extending from the insulating layer to the vertex and forming a curved surface with a radius substantially equal to the length of the first side. The vertex can be positioned on a line connecting the surface of the substrate and the deposition source. The method can further comprise fixing the substrate to a substrate support having a curved surface substantially equal to the predetermined curvature of the substrate. The method can further comprise fixing another substrate to the substrate support, wherein the substrate support has a substantially symmetric structure having two curved surfaces substantially equal to the predetermined curvatures of the substrates. A center axis of the deposition source can be substantially parallel to the normal of the central portion of the substrate.

In exemplary embodiments, the predetermined curvature of the substrate is a logarithmic spiral defined in polar coordinates reflected in the following Equation 1 or Equation 2 with the deposition source located at the pole:

$$r = ae^{b\theta} \qquad \text{Equation 1}$$

$$\theta = (1/b)\ln(r/a), \qquad \text{Equation 2}$$

wherein e is the base of the natural logarithm, a is an arbitrary real constant, and b is $\cot\theta$.

In exemplary embodiments, the equal angle is between about 1 degree to about 45 degrees. The method can further comprise disposing an open mask over the substrate, wherein the open mask has an opening which exposes an area of the substrate including the shadow masks. The depositing can comprise at least one of sputtering method, evaporation method, vaporization method, or sublimation method. The deposition material can comprise at least one of a conducting material or a metal. The method can further comprise forming a thin film transistor over the substrate; forming a second insulating layer over the substrate and the thin film transistor; and forming a via hole in the second insulating layer for connecting the thin film transistor to the first electrode.

Another aspect is a deposition apparatus for forming a thin film for a display device comprising a deposition source configured to deposit a deposition material in a plurality of deposition directions so as to form the thin film on a substrate; and a substrate support configured to hold the substrate during the deposition, wherein the substrate support includes a surface contacting the substrate, and wherein the surface has a logarithmic curvature configured such that angles between the normals of each point on a surface of the substrate and the deposition directions are substantially the same.

DETAILED DESCRIPTION OF CERTAIN INVENTIVE EMBODIMENTS

Figure 1A:
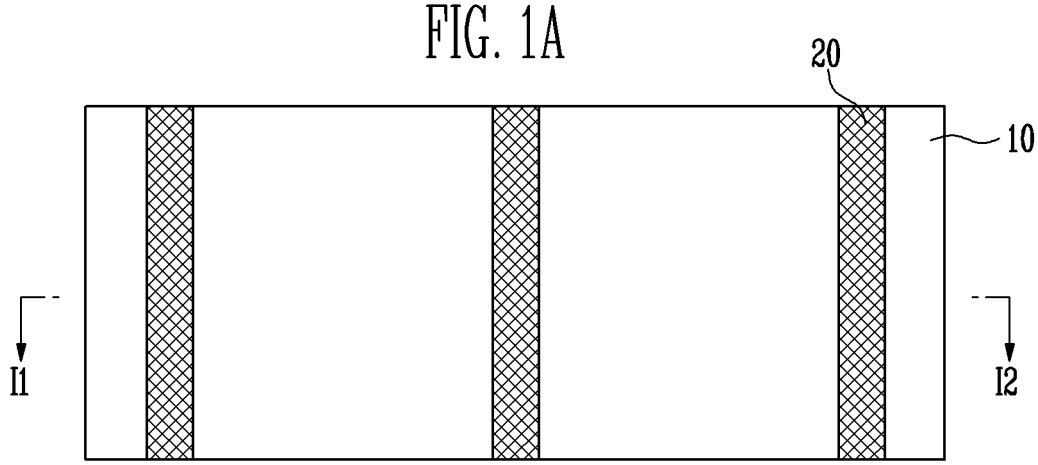
FIG. 1A is a plan view illustrating a method for depositing a thin film according to an embodiment.

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the exemplary embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

In the following detailed description, only certain exemplary embodiments of the described technology have been shown and described, simply by way of illustration. As those skilled in the art would realize, the described embodiments may be modified in various different ways, all without departing from the spirit or scope of the described technology. Accordingly, the drawings and description are to be regarded as illustrative in nature and not restrictive. In addition, when an element is referred to as being "on" another element, it can be directly on the other element or be indirectly on the other element with one or more intervening elements interposed therebetween. Also, when an element is referred to as being "connected to" another element, it can be directly connected to the other element or be indirectly connected to the another element with one or more intervening elements interposed therebetween. Hereinafter, like reference numerals refer to like elements.

First, a method for depositing a thin film according to an embodiment will be described with reference to the accompanying drawings.

Figure 1B:
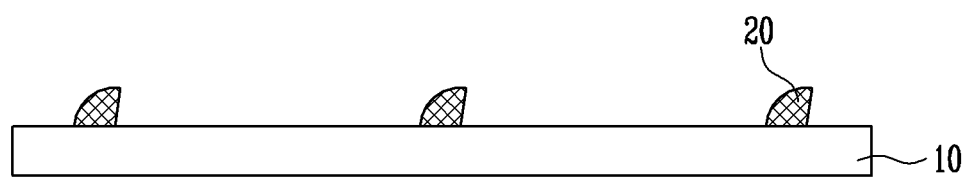
FIG. 1B is a sectional view taken along line I1-I2 of FIG. 1A.

Referring to FIGS. 1A and 1B, a plurality of shadow masks 20 are formed on a substrate 10.

The substrate 10 may be formed of at least one of glass, polymer, metal or silicon, or one or more compounds thereof. The substrate 10 preferably has flexibility.

The shadow masks 20 are arranged in row and column directions. The shadow masks 20 arranged in the column directions are connected to each other to form a stripe shape and the shadow masks 20 may be spaced apart from each other at regular intervals. Thus, in some embodiments, the shadow masks 20 extend in the column direction and are substantially equally spaced apart from each other in the row direction.

Figure 1C:
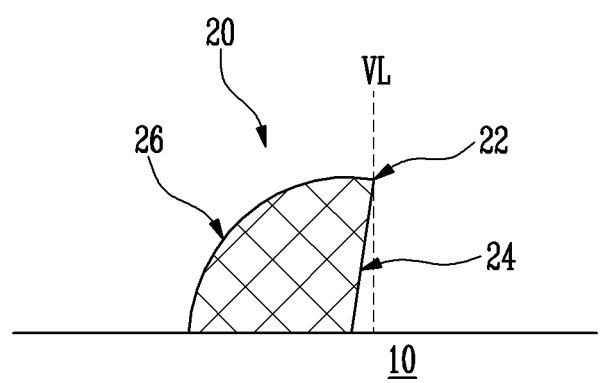
FIG. 1C is a partial sectional view illustrating a shadow mask.

Referring to FIG. 1C, the shadow mask 20 is formed in an asymmetric structure including a vertex 22 positioned on a vertical line VL which is perpendicular with respect to a surface of the substrate 10, a first side 24 forming an acute angle with the surface of the substrate 10, and a second side 26 connected to the surface of the substrate 10 and the first side 24 through the vertex 22. In some embodiments, the length of the first side 24 is the radius of the curvature of the second side 26.

The vertex 22 may be positioned on the line connecting the surface of the substrate 10 and a deposition source. The first and second sides 24 and 26 may be formed to have a curved surface. Alternatively, the first side 24 may be formed as a planar surface and the second side 26 may be formed to have a curved surface.

The shadow masks 20 may be formed of an inorganic or organic electrically insulating material. For example, the shadow masks 20 may be formed by sequentially forming an insulating layer and a photoresist layer on the substrate 10, patterning the photoresist layer through a lithography and development process, and then patterning the insulating layer through a dry etching process using the patterned photoresist layer as a mask.

Figure 2:
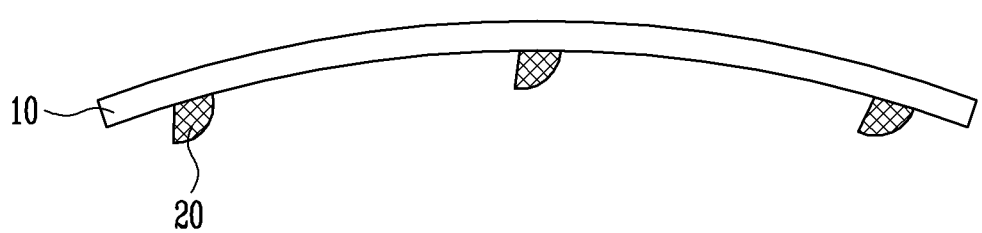
FIG. 2 is a sectional view illustrating a method for forming a thin film according to an embodiment.

Referring to FIG. 2, the substrate 10 is bent and then fixed so that the surface of the substrate 10 has a predetermined curvature.

In some embodiments, the curvature of the surface of the substrate 10 corresponds to a logarithmic spiral.

Figure 3A:
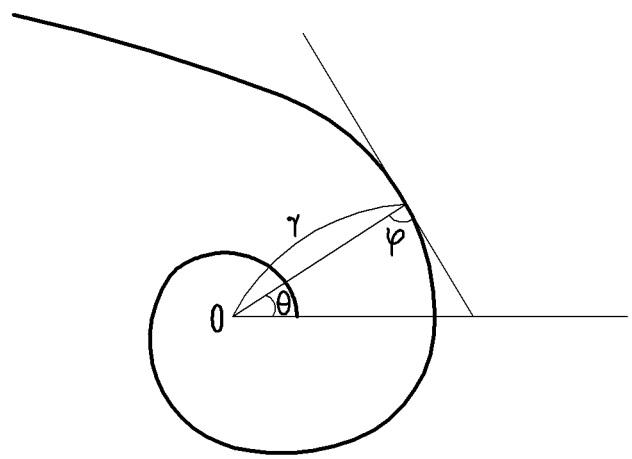
FIGS. 3A and 3B are graphs illustrating a logarithmic spiral.

Referring to FIG. 3A, when the polar coordinate using zero as a starting point (definite point or pole) is (r, θ), the logarithmic spiral may be defined as shown in the following Equation 1 or 2.

$$r = ae^{b\theta} \qquad \text{Equation 1}$$

$$\theta = (1/b)\ln(r/a) \qquad \text{Equation 2}$$

Here, e is the base of the natural logarithm, a is an arbitrary real constant, and b is cotθ.

In Equation 1 or 2, if a and b are real numbers, the curved line is defined as shown in the following Equations 3 and 4.

$$x(t) = r(t)\cos(t) = ae^{b\theta}\cos(t) \qquad \text{Equation 3}$$

$$y(t) = r(t)\sin(t) = ae^{b\theta}\sin(t) \qquad \text{Equation 4}$$

The logarithmic spiral has a characteristic in which the angle (100) between the tangent and the radial line is constant at each coordinate (r, θ).

Figure 3B:
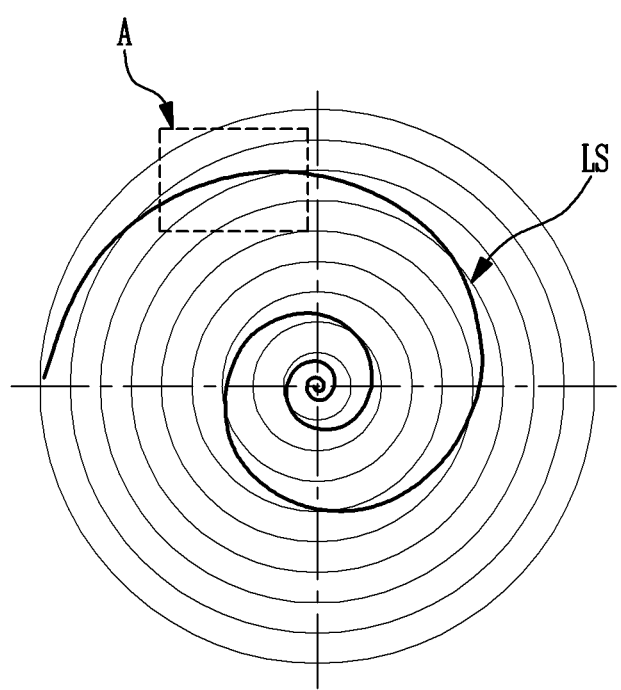

Referring to FIG. 3B, the logarithmic spiral LS is a spiral obtained by cutting all straight lines starting from the starting point. When θ is a constant, the angle between the straight line and the spiral is constant in all sections (e.g., portion A).

Figure 4:
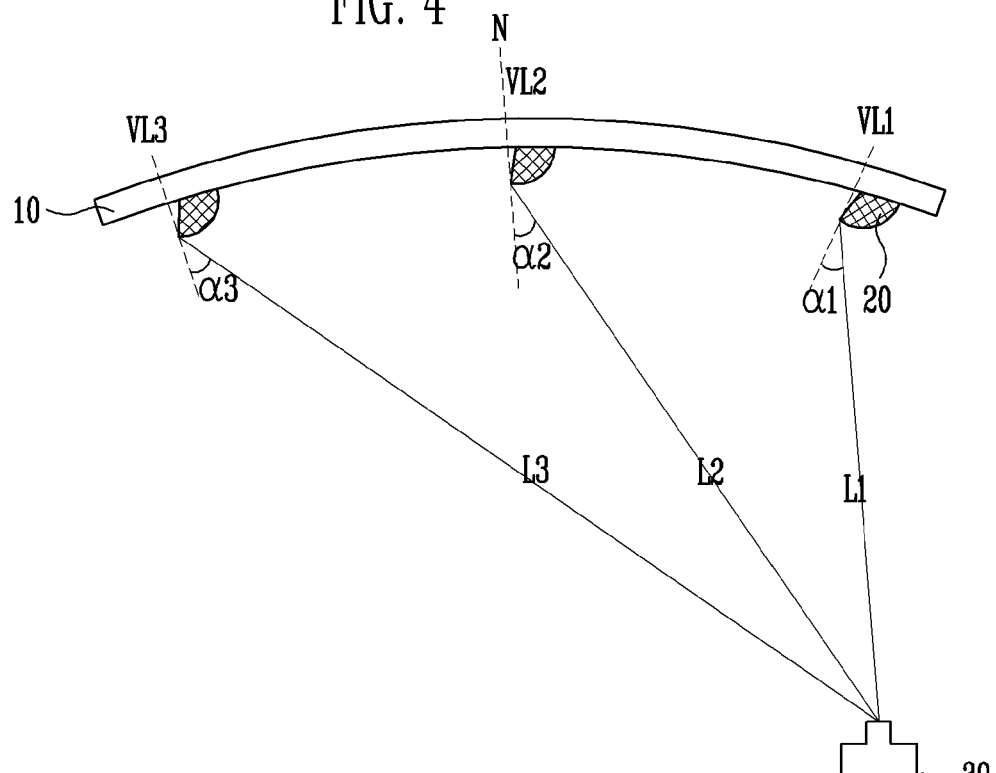
FIGS. 4 to 7 are sectional views illustrating a method for forming a thin film according to an embodiment.

Referring to FIG. 4, a deposition source 30 is disposed at a position having substantially equal angles with respect to central and peripheral portions of the substrate 10. In some embodiments, the deposition source is positioned at the starting point or pole of the logarithmic spiral defined by the substrate 10. The central and peripheral portions are arbitrary positions and the peripheral portion may include all positions from the central portion to an edge portion. That is, the central and peripheral portions of the substrate 10 may refer to the entire surface of the substrate 10. Thus, a radial line originating from the deposition source 10 forms a substantially equal angle with respect to each position of the substrate 10.

The equal angles are angles α1, α2, and α3 between lines perpendicular to the surface of the substrate 10, e.g., a vertical line VL2 at the central portion of the substrate 10 and vertical lines VL1 and VL3 at the peripheral portions of the substrate 10, and lines L1, L2 and L3 connecting the surface of the substrate 10, the vertices 22 of the shadow masks 20, and the deposition source 30. Here, the angles α1, α2, and α3 are substantially equal to one another. The equal angles may be between about 1 to about 45 degrees.

In the case where the angle α2 between the vertical line VL2 at the central portion of the substrate 10 and the line L2 is substantially equal to the angles α1 and α3 between the vertical lines VL1 and VL3 at the peripheral portions of the substrate 10 and the lines L1 and L3, the deposition source 30 may be located such that the center axis of the deposition source is substantially parallel to the normal N of the central portion of the substrate 10.

Figure 5:
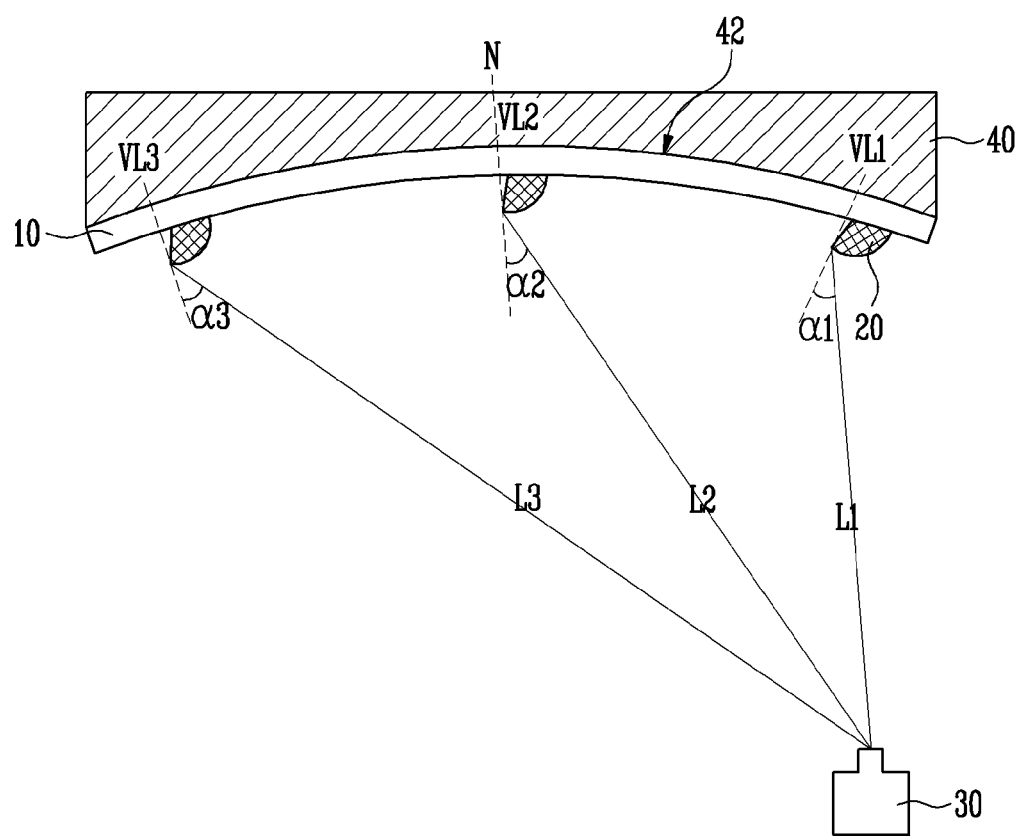

Referring to FIG. 5, the substrate 10 may be fixed to a substrate support 40 having a surface 42 with a curvature having a logarithmic spiral corresponding to that of the substrate 10.

Figure 6:
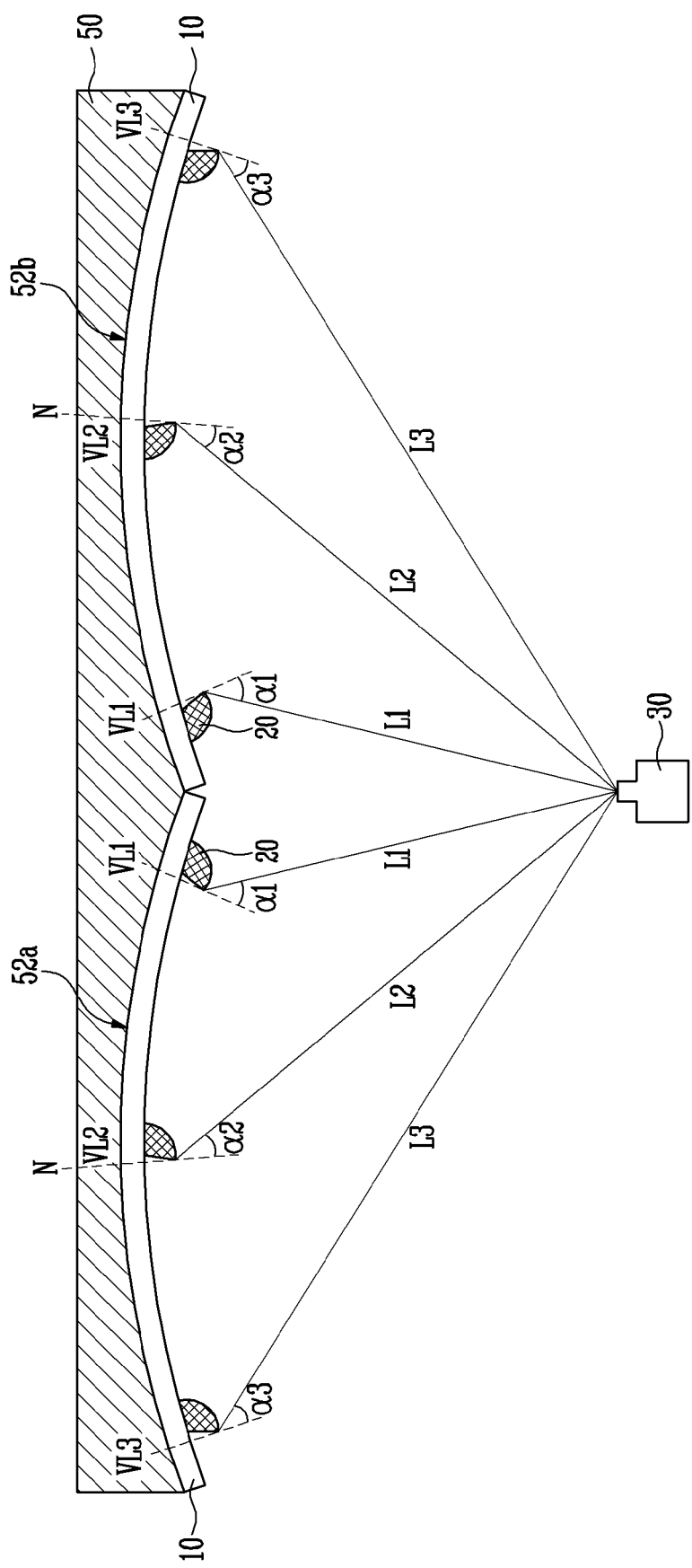

Referring to FIG. 6, a substrate support 50 is formed into a symmetric structure in which surfaces 52a and 52b have symmetric curvatures and two substrates 10 may be respectively fixed to the surfaces 52a and 52b with the symmetric structure. In this case, the deposition source 30 is disposed at a position having an equal angle with respect to each of the central and peripheral portions of each substrate 10. Thus, a thin film can be simultaneously deposited on the two substrates 10 through a single deposition process.

Figure 7:
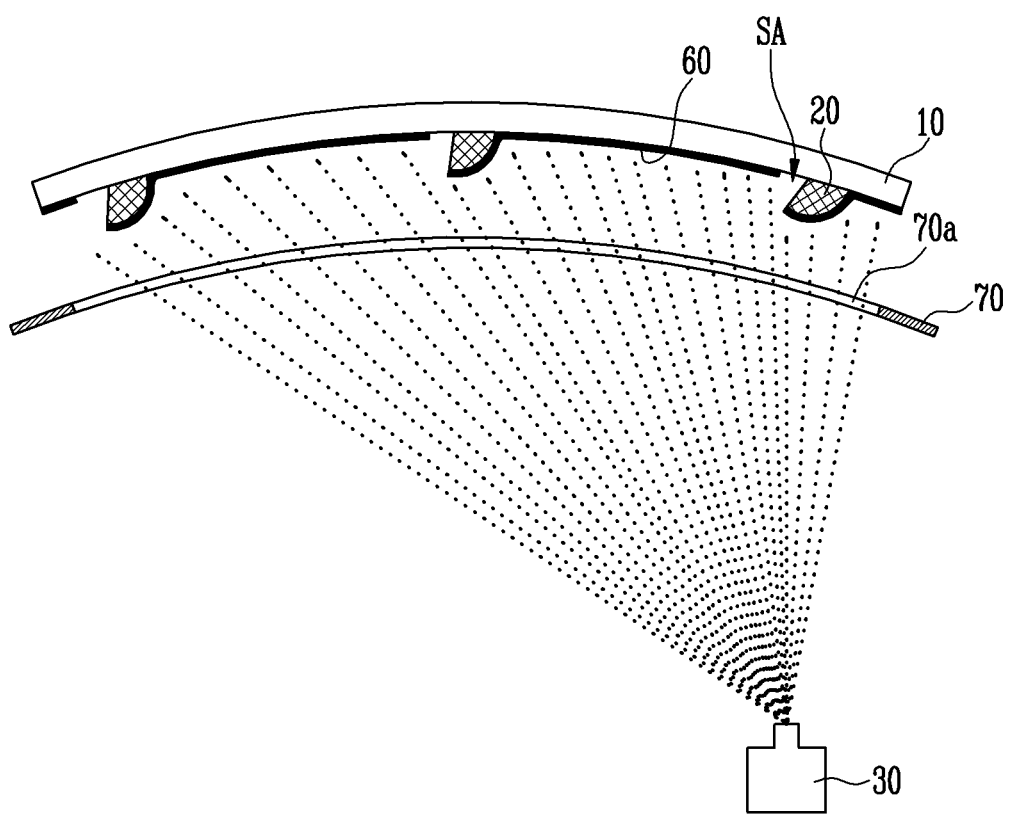

Referring to FIG. 7, a thin film 60 is deposited on the substrate 10 including the shadow masks 20 from the deposition source 30.

The deposition source 30 may be configured to evaporate, vaporize or sublimate a deposition material, or may be configured as a sputtering device.

An open mask 70 may be disposed above the substrate 10 so that the thin film 60 can be deposited in only a desired area. Since an opening 70a is formed in the open mask 70 so that a predetermined area of the substrate 10 including the plurality of shadow masks 20 is exposed, the thin film 60 can be deposited in only the area exposed by the opening 70a.

The open mask 70 is preferably curved to have a curvature similar to that of the substrate 10, so that the distance between the substrate 10 and the open mask 70 is constant.

For example, if a conducting material or metal material is used as a deposition material in a crucible of the deposition source 30 and the crucible is heated using a heater, the material is evaporated, vaporized or sublimated in the direction of the substrate 10, thereby depositing the thin film 60. In this case, the surface of the substrate 10, adjacent to the first sides 24 of the shadow masks 20, becomes a shadow area SA with respect to the deposition source 30, and hence the thin film is not deposited in the shadow area SA. The shadow area SA provides a distance spaced between the thin films 60. Since the deposition source 30 is disposed at a position having equal angles with respect to the central and peripheral portions of the substrate 10, the positions and sizes of the shadow areas SA at the central and peripheral portions of the substrate 10 are substantially uniform.

The size of the shadow area SA, i.e., the distance between the thin films 60 may be determined by the height of the shadow mask 20 and the angles α1, α2, and α3.

Since the central and peripheral portions of the substrate 10 are maintained at a constant angle with respect to the deposition source 30, the thin film 60 can be deposited to have a substantially uniform thickness. Since the positions and sizes of the shadow areas SA are substantially uniform, the thin film can be formed to have substantially a uniform width and spacing.

The thin film 60 may be used as an electrode or wire. For example, the thin film 60 may be applied in forming an electrode of an organic light-emitting diode (OLED) constituting a display unit of an OLED display or in forming a sensing electrode of a touch screen, etc.

FIGS. 8A to 8E are sectional views illustrating a method for fabricating an OLED display according to an embodiment.

Figure 8A:
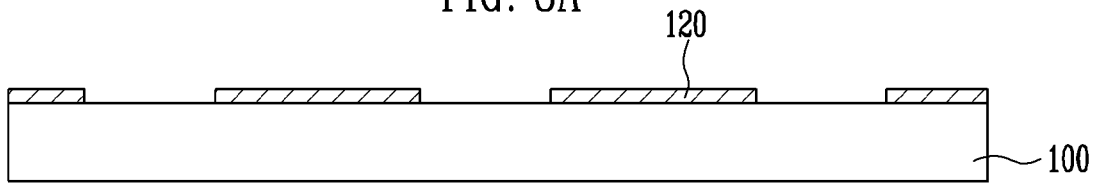
FIGS. 8A to 8E are sectional views illustrating a method for fabricating an OLED display according to an embodiment.

Referring to FIG. 8A, a plurality of first electrodes 120 are formed on a substrate 100.

The substrate 100 may be formed of at least one of glass, polymer, metal or silicon, or one or more compounds thereof. The substrate 100 preferably has flexibility.

The first electrode 120 is, for example, an anode electrode of an OLED and may be formed of a transparent conductive material such as indium tin oxide (ITO) or indium zinc oxide (IZO), a metal such as chrome (Cr), gold (Au), silver (Ag), or aluminum (Al), or an alloy thereof.

Figure 8B:
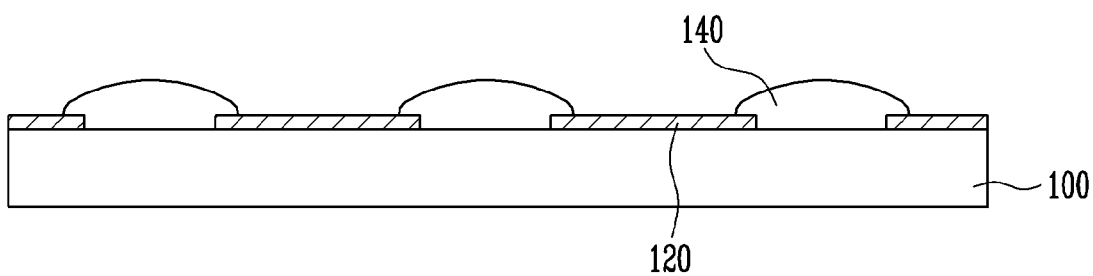

Referring to FIG. 8B, insulating layers 140 are formed on the substrate 100 including the first electrodes 120. The insulating layer 140 is patterned so that an emission area of the first electrode 120 is exposed.

The insulating layer 140 is a pixel defining layer for defining pixels and electrically insulating the pixels. The insulating layer 140 may be formed of an organic material such as acryl resin or polyimide resin, or an inorganic material such as silicon oxide ($SiO_2$), titanium oxide ($TiO_2$), or silicon nitride ($SiN_x$).

Figure 8C:
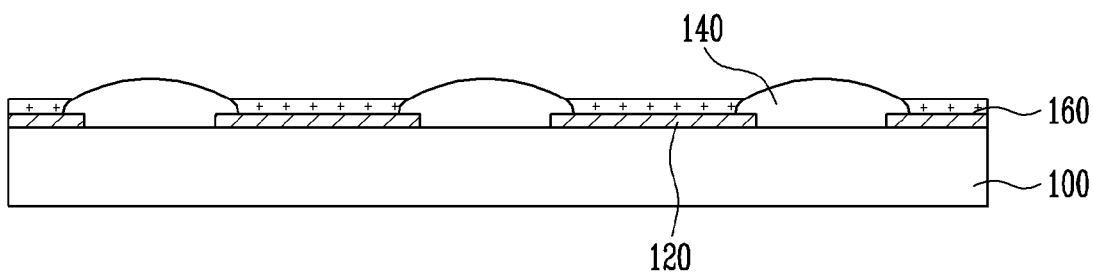

Referring to FIG. 8C, an organic thin film layer 160 is formed on the exposed first electrode 120.

The organic thin film layer 160 includes a hole injection layer, an emission layer and an electron injection layer. The organic thin film layer 160 may further include a hole transport layer and an electron transport layer. The emission layer generally includes at least one materials which can emit red, green, blue, or white light.

Figure 8D:
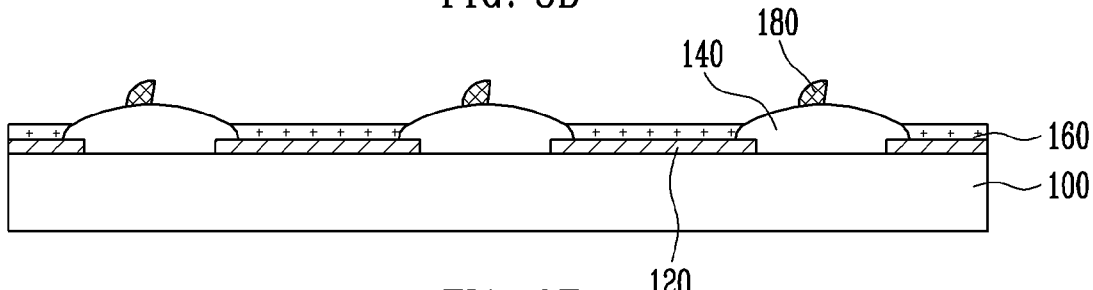

Referring to FIG. 8D, a shadow mask 180 is formed on the insulating layer 140.

The shadow mask 180 may be formed of an inorganic or organic material. For example, the shadow mask 180 may be formed by depositing an inorganic or organic insulating material on the substrate 100 and patterning an insulating layer through a lithography and dry etching process using a photoresist layer.

The shadow mask 180, as shown in FIG. 1C, is formed into an asymmetric structure including a vertex 22, a first side 24, and a second side 26. A plurality of shadow masks 180 formed on the respective insulating layers 140, as shown in FIGS. 1A and 1B, are necessarily spaced apart from each other at an equal interval.

The substrate 100 having the shadow masks 180 formed thereon is bent and then fixed so that the surface of the substrate 100 has a predetermined curvature. The substrate 100 may be fixed to the substrate support 40 or 50 shown in FIG. 5 or 6.

A deposition source 30, as shown in FIG. 4, is disposed at a position having an equal angle with respect to each of the central and peripheral portions of the substrate 100.

Figure 8E:
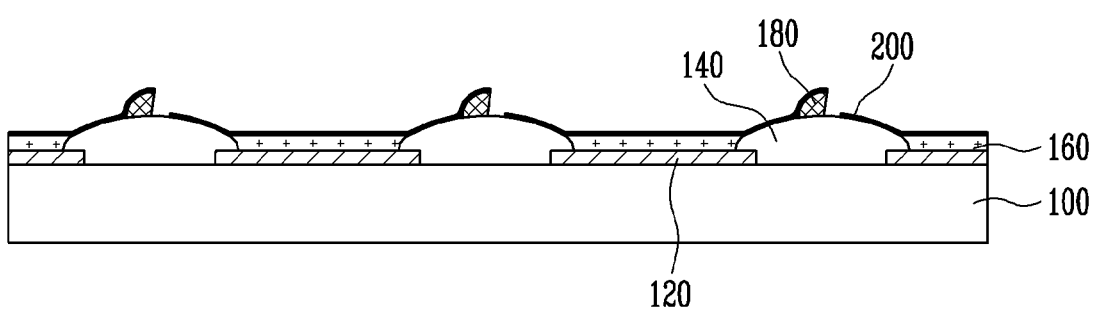

Referring to FIG. 8E, a thin film is deposited on the shadow mask 180 and the organic thin film layer 160 from the deposition source 30, thereby forming second electrodes 200.

The second electrode 200 is a cathode electrode of the OLED and may be formed of a metal such as Al or Ag.

Figure 9:
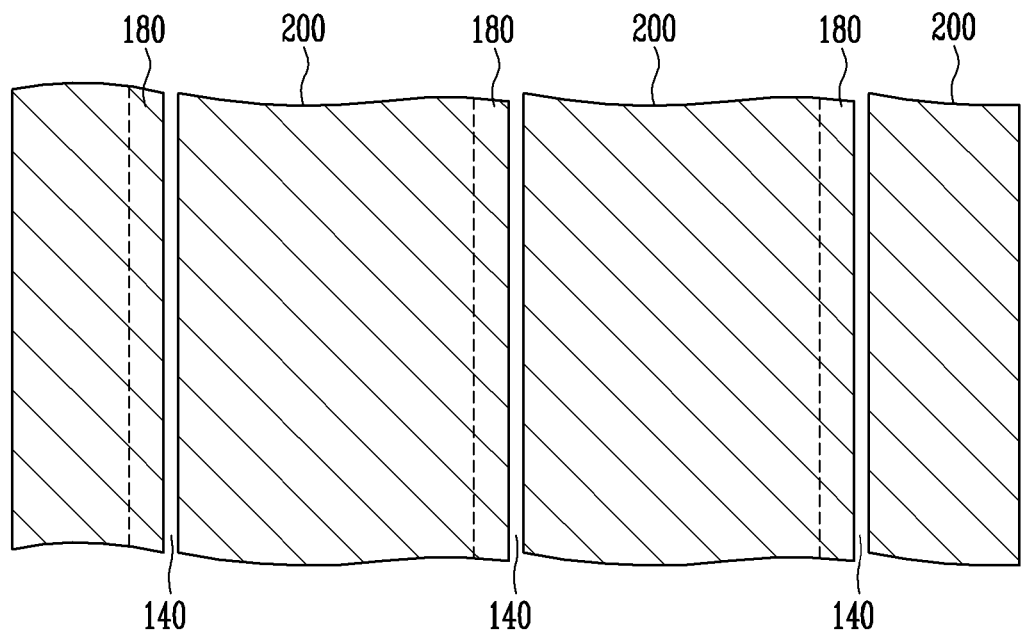
FIG. 9 is a plan view illustrating a method for fabricating an OLED display according to an embodiment.

FIG. 9 is a plan view of FIG. 8D. The deposition source is disposed at the position having an equal angle with respect to each of the central and peripheral portions of the substrate 100. Since the surface of the substrate 100 is curved to have a constant curvature with respect to the deposition source, the second electrodes 200 can be formed to have a substantially uniform thickness over the entire substrate 100. Since the thin film is not deposited in a shadow area formed by the shadow mask 180, the second electrode 200 may be formed with a constant width at a constant interval.

In the case where the shadow masks 180 are formed in a stripe shape, the second electrodes 200 are formed to have a stripe shape. One of the sides of the second electrodes 200 may be connected to each other when necessary. For example, the second electrodes 200 may be used as sensing electrodes of an in-cell type touch screen.

Since the thickness and width of the second electrodes 200 are constant, the second electrodes 200 have substantially the same self-resistance value. Since the spacing between the second electrodes 200 is also constant, the signal-to-noise ratio is excellent due to substantially uniform parasitic capacitance.

Figure 10:
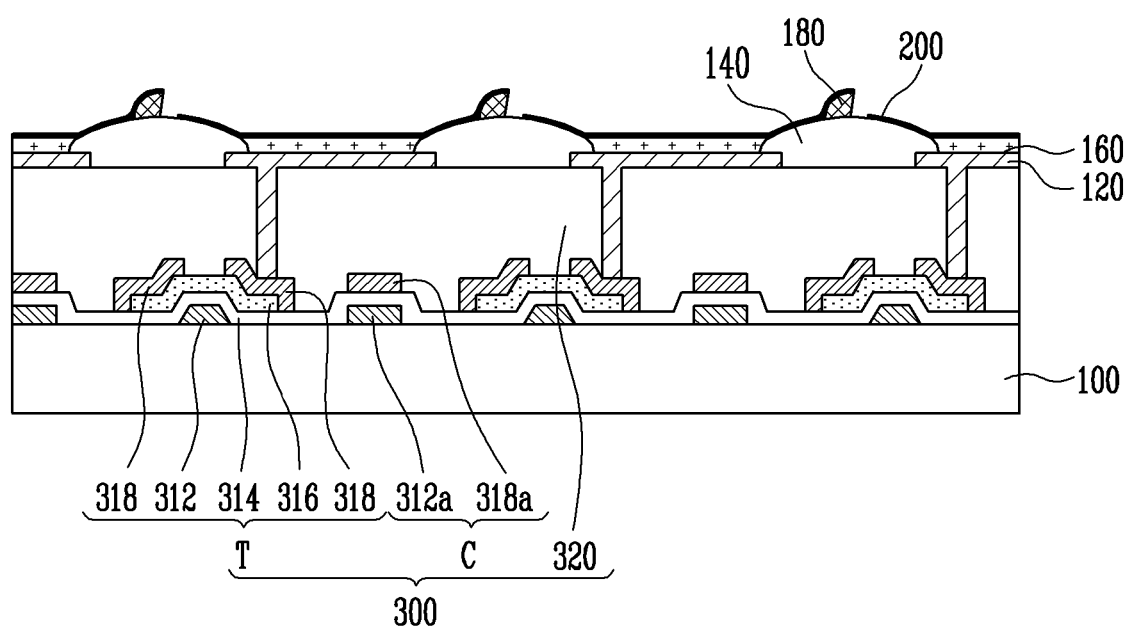
FIG. 10 is a sectional view illustrating a method for fabricating an OLED display according to another embodiment.

FIG. 10 is a sectional view illustrating a method for fabricating an OLED display according to another embodiment.

Referring to FIG. 10, a device forming layer 300 may be formed on a substrate 100.

The device forming layer 300 may include a thin film transistor T for transmitting a signal to an OLED, a capacitor C for maintaining the signal, and an insulating layer 320 formed on the substrate 100 including the thin film transistor T and the capacitor C.

The thin film transistor T includes a gate electrode 312 formed on the substrate 100, a semiconductor layer 316 disposed above the gate electrode 312 and electrically insulated from the gate electrode 312 by an insulating layer 314, and source and drain electrodes 318 respectively connected to source and drain areas of the semiconductor layer 316.

The capacitor C is formed on the substrate 100 adjacent to the thin film transistor T. The capacitor C may be formed into a laminated structure of a lower electrode 312a, the insulating layer 314, and an upper electrode 318a.

A first electrode 120 of the OLED is formed on the device forming layer 300 configured as described above and is connected to the source or drain electrode 318 of the thin film transistor T. The first electrode 120 may be connected to the source or drain electrode 318 of the thin film transistor T through a via hole of the insulating layer 320 formed between the thin film transistor T and the first electrode 120.

Subsequently, as described with reference to FIGS. 8B to 8D, the OLED is completed by sequentially forming an organic thin film layer and a second electrode.

Figure 11:
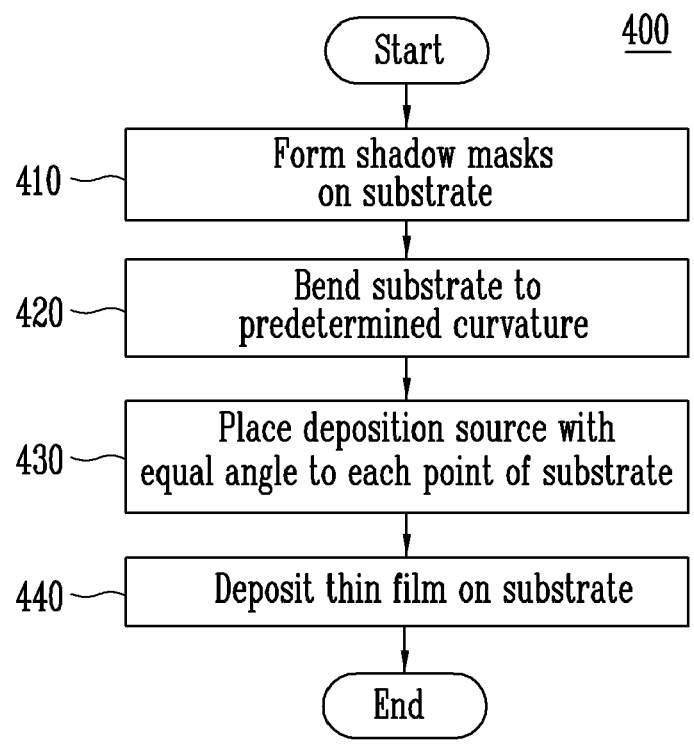
FIG. 11 is a flowchart illustrating an exemplary procedure for forming a thin film according to an embodiment.

FIG. 11 is a flowchart showing an exemplary procedure 400 for forming a thin film according to one embodiment. Depending on the embodiment, additional states may be added, others removed, or the order of the states changed in FIG. 4. In state 410, shadow masks are formed on a substrate. In state 420, the substrate is bent to a predetermined curvature. The predetermined curvature may be a logarithmic curvature. In state 430, a deposition source is placed to form an equal angle with respect to central and peripheral portions of the substrate. The equal angle may be formed with respect to each point of the substrate. In state 440, the thin film is formed on the substrate by deposition.

By way of summation and review, in a typical method of forming an electrode or a wire, a conductive layer was deposited on a substrate and then patterned through lithography and etching processes using a photoresist layer. The lithography process is a process of forming a photoresist pattern through exposure and development processes using a mask and the etching process is a process of etching the conductive layer into a predetermined pattern, using the photoresist pattern.

Several processes should be performed in order to form the electrode or wire as described above. Hence, in the typical method, the fabricating cost is relatively high and increased and the yield is low.

According to at least one embodiment, a substrate is bent and then fixed to have a predetermined curvature and a deposition source is positioned at a position having an equal angle with respect to each of central and peripheral portions of the substrate. In addition, shadow masks are formed so that shadow areas with a constant size are formed at positions having a constant angle with respect to the deposition source. Since each of the central and peripheral portions of the substrate are positioned to have the equal angle with respect to the deposition source, a thin film can be deposited to have a substantially uniform thickness. Since the positions and sizes of the shadow areas are uniform, electrodes or wires with substantially uniform width and spacing can be formed.

According to some embodiments, the number of processes and the time taken to perform the processes is decreased when compared with typical processes, so that it is possible to reduce the manufacturing cost and increase the yield.

In the case where the described technology is applied in fabricating an OLED display, the electrode of the OLED can be used as a sensing electrode of a touch screen. Thus, it is possible to easily implement an in-cell type touch screen and to implement a sensing electrode having excellent signal-to-noise ratio.

Exemplary embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the described technology as set forth in the following claims.

What is claimed is:

1. A method for forming a thin film, the method comprising:
   forming shadow masks on a substrate;
   bending the substrate to have a predetermined curvature;
   placing a deposition source at a position having a substantially equal angle with respect to the shadow masks and central and peripheral portions of the substrate; and
   depositing a deposition material from the deposition source onto the substrate and the shadow masks so as to form a thin film.

2. The method of claim 1, wherein the substrate includes at least one material selected from the group consisting of glass, polymer, metal and silicon.

3. The method of claim 1, wherein the shadow masks are formed in row and column directions.

4. The method of claim 3, wherein the shadow masks i) are substantially equally spaced apart in the row direction and ii) extend in the column direction.

5. The method of claim 1, wherein each of the shadow masks includes i) a vertex formed over the substrate, ii) a first side extending from the substrate to the vertex and forming an acute angle with the substrate, and iii) a second side extending from the substrate to the vertex and forming a curved surface with a radius substantially equal to the length of the first side.

6. The method of claim 5, wherein the vertex is positioned on a line connecting the surface of the substrate and the deposition source.

7. The method of claim 5, wherein the first and second sides are formed in a curved surface.

8. The method of claim 5, wherein the first side has a plane surface and wherein the second side has a curved surface.

9. The method of claim 1, further comprising fixing the substrate to a substrate support having a curved surface substantially equal to the predetermined curvature of the substrate.

10. The method of claim 9, further comprising fixing another substrate to the substrate support, wherein the substrate support has a substantially symmetric structure having two curved surfaces substantially equal to the predetermined curvatures of the substrates.

11. The method of claim 1, wherein the deposition source is located such that a center axis of the deposition source is substantially parallel to the normal of the central portion of the substrate.

12. The method of claim 1, wherein the predetermined curvature of the substrate is a logarithmic spiral defined in polar coordinates reflected in the following Equation 1 or Equation 2 with the deposition source located at the pole:

$$r=ae^{b\theta} \qquad \text{Equation 1}$$

$$\theta=(1/b)\ln(r/a), \qquad \text{Equation 2}$$

wherein e is the base of the natural logarithm, a is an arbitrary real constant, and b is $\cot\theta$.

13. The method of claim 1, wherein the equal angle is between about 1 degree to about 45 degrees.

14. The method of claim 1, further comprising disposing an open mask over the substrate wherein the open mask has an opening which exposes an area of the substrate including the shadow masks.

15. The method of claim 1, wherein the depositing comprises at least one of sputtering method, evaporation method, vaporization method, or sublimation method.

16. The method of claim 1, wherein the deposition material comprises at least one of a conducting material or a metal.

17. A method for fabricating an organic light-emitting diode (OLED) display, comprising:
    forming a first electrode including an emission area over a substrate;
    forming an insulating layer over the substrate and the first electrode;
    patterning the insulating layer to expose the emission area of the first electrode;
    forming an organic thin film layer over the emission area;
    forming a plurality of shadow masks over the insulating layer;
    bending the substrate to have a predetermined curvature;
    placing a deposition source at a position having a substantially equal angle with respect to the shadow masks and central and peripheral portions of the substrate; and
    depositing a deposition material from the deposition source onto the shadow masks and the organic thin film layer so as to form a second electrode.

18. The method of claim 17, wherein the substrate includes at least one material selected from the group consisting of glass, polymer, metal and silicon.

19. The method of claim 17, wherein each of the shadow masks includes i) a vertex formed over the insulating layer, ii) a first side extending from the insulating layer to the vertex, and iii) a second side extending from the insulating layer to the vertex and forming a curved surface with a radius substantially equal to the length of the first side.

20. The method of claim 19, wherein the vertex is positioned on a line connecting the surface of the substrate and the deposition source.

21. The method of claim 17, further comprising fixing the substrate to a substrate support having a curved surface substantially equal to the predetermined curvature of the substrate.

22. The method of claim 21, further comprising fixing another substrate to the substrate support, wherein the substrate support has a substantially symmetric structure having two curved surfaces substantially equal to the predetermined curvatures of the substrates.

23. The method of claim 17, wherein a center axis of the deposition source is substantially parallel to the normal of the central portion of the substrate.

24. The method of claim 17, wherein the predetermined curvature of the substrate is a logarithmic spiral defined in polar coordinates reflected in the following Equation 1 or Equation 2 with the deposition source located at the pole:

$$r=ae^{b\theta} \qquad \text{Equation 1}$$

$$\theta=(1/b)\ln(r/a), \qquad \text{Equation 2}$$

wherein e is the base of the natural logarithm, a is an arbitrary real constant, and b is $\cot\theta$.

25. The method of claim 17, wherein the equal angle is between about 1 degree to about 45 degrees.

26. The method of claim 17, further comprising disposing an open mask over the substrate, wherein the open mask has an opening which exposes an area of the substrate including the shadow masks.

27. The method of claim 17, wherein the depositing comprises at least one of sputtering method, evaporation method, vaporization method, or sublimation method.

28. The method of claim 17, wherein the deposition material comprises at least one of a conducting material or a metal.

29. The method of claim 17, further comprising:
    forming a thin film transistor over the substrate;
    forming a second insulating layer over the substrate and the thin film transistor; and
    forming a via hole in the second insulating layer for connecting the thin film transistor to the first electrode.

* * * * *